United States Patent [19]
Rasmussen

[11] Patent Number: 5,561,398
[45] Date of Patent: Oct. 1, 1996

[54] LC-TUNED VOLTAGE CONTROLLED RING OSCILLATOR

[75] Inventor: Richard R. Rasmussen, Fremont, Calif.

[73] Assignee: National Semiconductor Corporation, Santo Clara, Calif.

[21] Appl. No.: 442,564

[22] Filed: May 16, 1995

[51] Int. Cl.$^6$ .................. H03B 5/12; H03L 7/099
[52] U.S. Cl. .................. 331/36 C; 331/45; 331/52; 331/57; 331/116 FE; 331/117 FE; 331/177 V
[58] Field of Search .................. 331/34, 36 C, 331/57, 50, 52, 117 R, 117 FE, 177 V, 116 R, 116 FE, 45

[56] References Cited

U.S. PATENT DOCUMENTS

| | | | |
|---|---|---|---|
| 3,355,673 | 11/1967 | Williams et al. | 331/117 R |
| 3,538,450 | 11/1970 | Andrea et al. | 331/177 V |
| 3,585,526 | 6/1971 | Zelinka | 331/116 R |
| 3,684,981 | 8/1972 | Kreitz | 331/116 R |
| 4,003,004 | 1/1977 | Fletcher et al. | 331/177 V |
| 4,141,209 | 2/1979 | Barnett et al. | 331/177 R |
| 4,169,248 | 9/1979 | Hongu et al. | 331/117 R |
| 4,581,593 | 4/1986 | Okanobu | 331/116 R |
| 5,180,994 | 1/1993 | Martin et al. | 331/57 |
| 5,231,361 | 7/1993 | Smith et al. | 331/56 |
| 5,434,543 | 7/1995 | Brilka et al. | 331/117 R |

FOREIGN PATENT DOCUMENTS

| 1466783 | 1/1967 | France | 331/57 |
|---|---|---|---|

OTHER PUBLICATIONS

Jan Craninckx et al., "A CMOS 1.8GHz Low–Phase–Noise Voltage–Controlled Oscillator With Prescaler," ISSCC95, Session 15, Frequency Synthesizers, Paper FA 15.5, IEEE International Solid–State Circuits Conference, 1995, pp. 266–267 and 206–207.

Nhat M. Nguyen et al., "A 1.8–GHz Monolithic LC Voltage–Controlled Oscillator," IEEE Journal of Solid–State Circuits, vol. 27, No. 3, Mar. 1992, pp. 444–450, 116–117, 232, 158–159 and 272.

Primary Examiner—Siegried H. Grimm
Attorney, Agent, or Firm—Skjerven, Morrill, MacPherson, Franklin & Friel; Brian D. Ogonowsky

[57] ABSTRACT

A differential delay stage for a ring oscillator utilizes a resonant circuit formed by an inductor and a capacitor consisting of two varactor diodes connected back-to-back. A common cathode connection is connected to a variable voltage source to vary the capacitance of the diodes. Other forms of capacitors may replace the varactor diodes. Varying the capacitance value varies the resulting oscillation frequency of the ring oscillator. When several delay stages, each incorporating the resonant circuit, are connected together in a ring, the net effect is to allow only a signal at the resonant frequency of the resonant circuits to propagate around the ring. Other oscillator circuits employing a resonant circuit are disclosed.

12 Claims, 7 Drawing Sheets

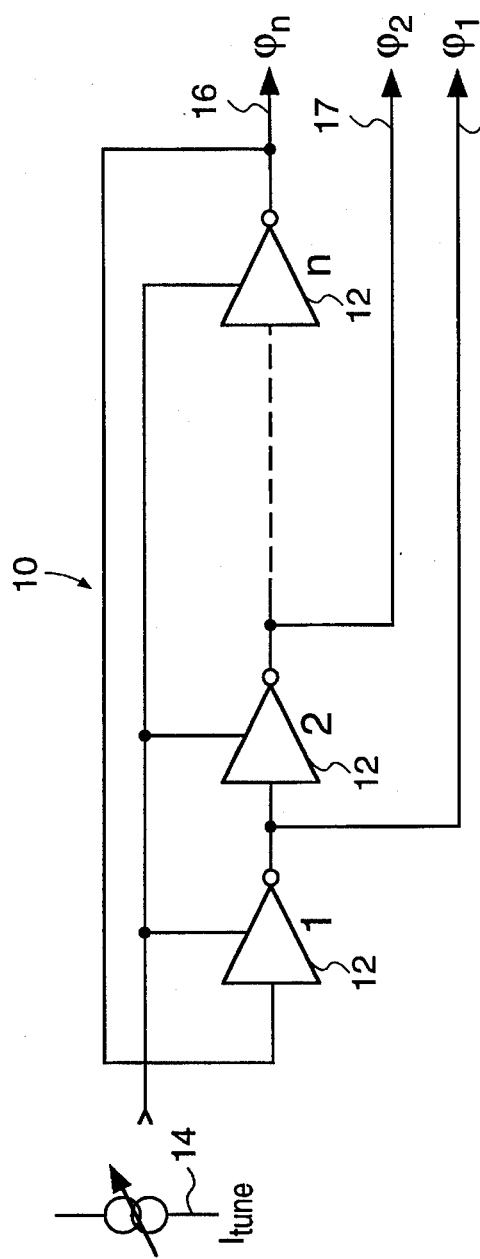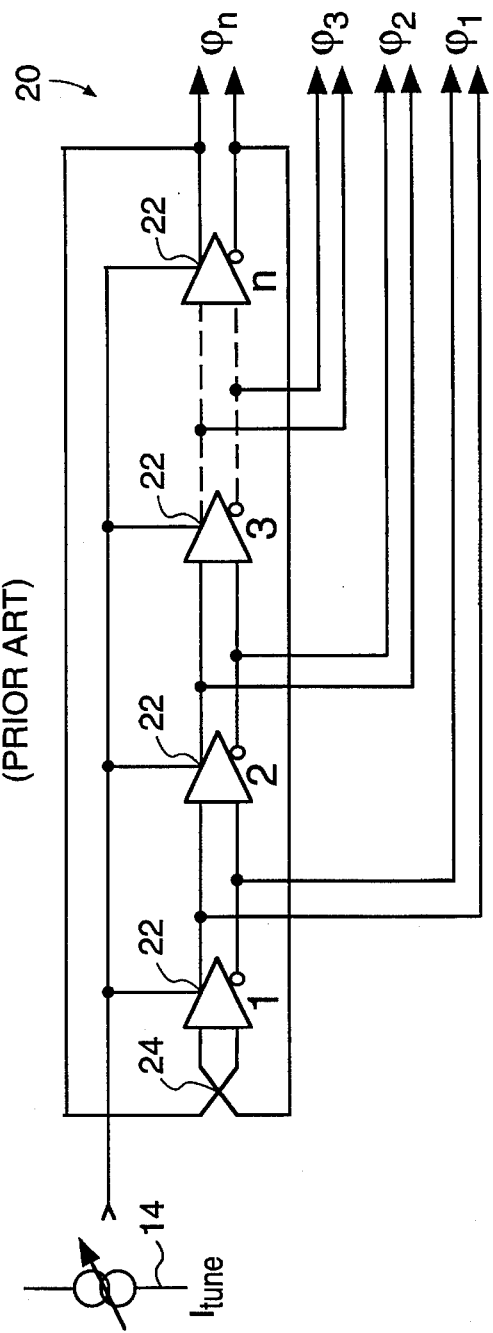

LC-TUNED VOLTAGE CONTROLLED RING OSCILLATOR

FIELD OF THE INVENTION

This invention relates to oscillators and, in particular, to a technique for improving the+stability of ring oscillators.

BACKGROUND OF THE INVENTION

A ring oscillator is typically comprised of a number of inverters connected in series as a ring. The inherent delays within each inverter causes the ring oscillator to oscillate in proportion to the total gate delay by the inverters in the ring.

If single-ended delay elements are employed, then there must be an odd number of inverters in the ring, as shown by the ring oscillator 10 in FIG. 1 formed of inverters 12. A tunable current source 14 may be provided to adjust the delay within each inverter 12 to vary the oscillation frequency to some extent.

One feature inherent in ring oscillator designs is that multiple phases, obtained at tapped outputs 16–18 of inverters 12, are automatically generated at no additional expense. These multiple phases may be used, for example, for clocking a number of circuits within a system.

FIG. 2 shows a ring oscillator 20 using inverters 22 which have a differential input and output. When differential inverters 22 are used, then an odd or an even number of inverters 22 in the ring is possible since the ring phase shift can be created at any point in the series string, such as the crossover identified at numeral 24. Differential multiple phases are produced at the outputs of the various inverters 22.

Each of the inverters in FIGS. 1 and 2 are typically formed of CMOS transistors. The delay (switching speed) of each inverter is undesirably very dependent upon the control input voltage. Thus the gain constant (switching speed versus control input voltage change) tends to be relatively high and very dependent upon process parameters such as MOS conductance, threshold voltage, and resistor sheet rho (if used in support biasing). This high gain constant can exacerbate voltage controlled oscillator (VCO) phase noise when the ring oscillator is used in phase-locked loop applications. External influences such as supply voltage variations, temperature gradients, and substrate noise coupling also contribute to the overall phase noise of these oscillators.

What is needed is a ring oscillator for providing multiple phases having improved frequency stability.

SUMMARY

A differential delay stage for a ring oscillator utilizes a resonant circuit formed by an inductor and a capacitor consisting of two varactor diodes connected back-to-back. The common cathode connection is connected to a variable voltage source to vary the capacitance of the diodes. Other forms of capacitors may replace the varactor diodes. Varying the capacitance value varies the resulting oscillation frequency of the ring oscillator. When several delay stages, each incorporating the resonant circuit, are connected together in a ring, the net effect is to allow only a signal at the resonant frequency of the resonant circuits to propagate around the ring. In another embodiment, a single-ended delay stage connected to a resonant circuit is used to stabilize the frequency of the oscillator.

BRIEF DESCRIPTION OF THE DRAWINGS

FIG. 1 is a schematic diagram of a conventional single-ended ring oscillator.

FIG. 2 is a schematic diagram of a conventional differential ring oscillator.

DETAILED DESCRIPTION OF THE PREFERRED EMBODIMENTS

Figure 3:
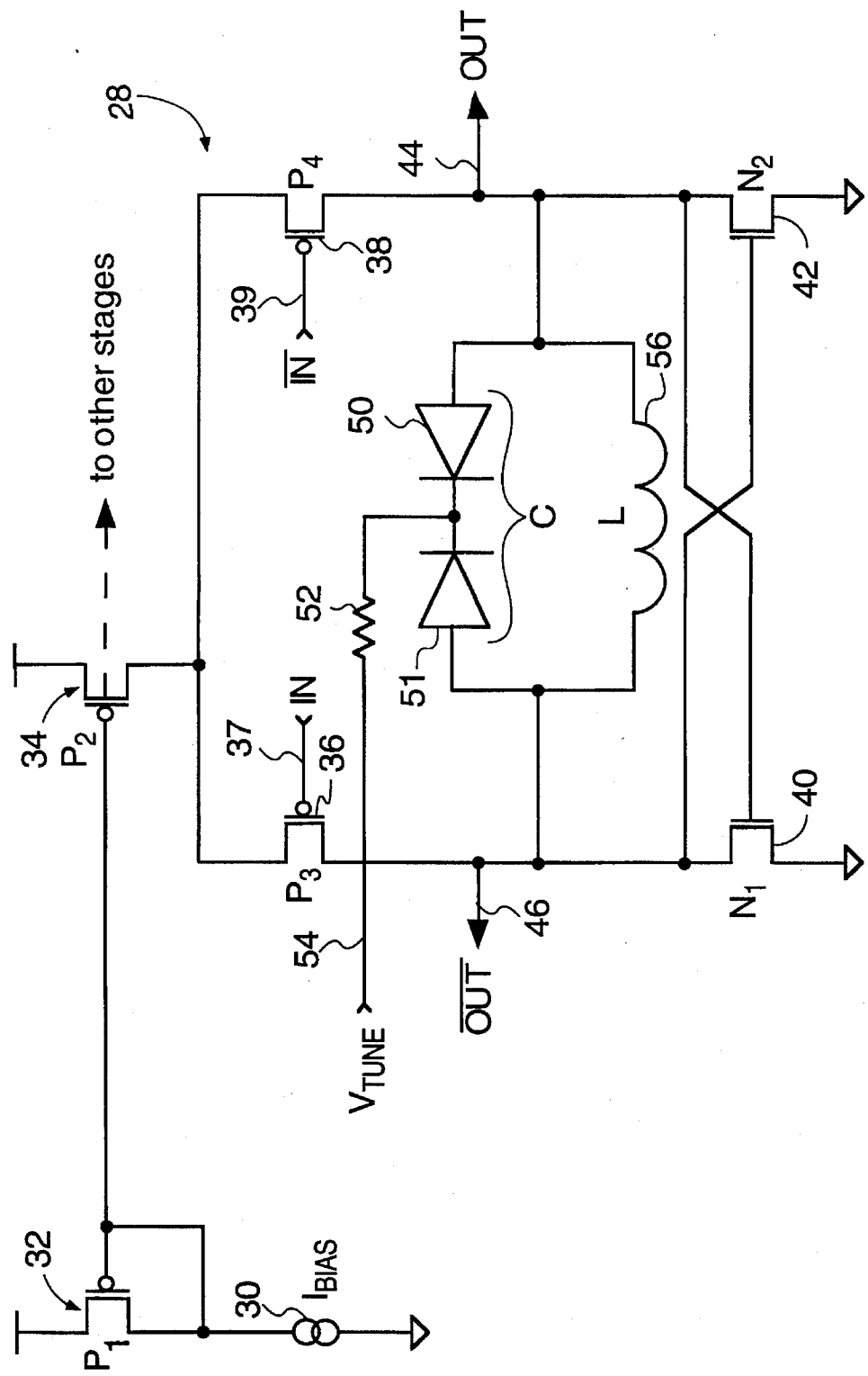
FIG. 3 is a schematic diagram of one delay stage in the inventive ring oscillator utilizing a resonant tank circuit.
Figure 5:
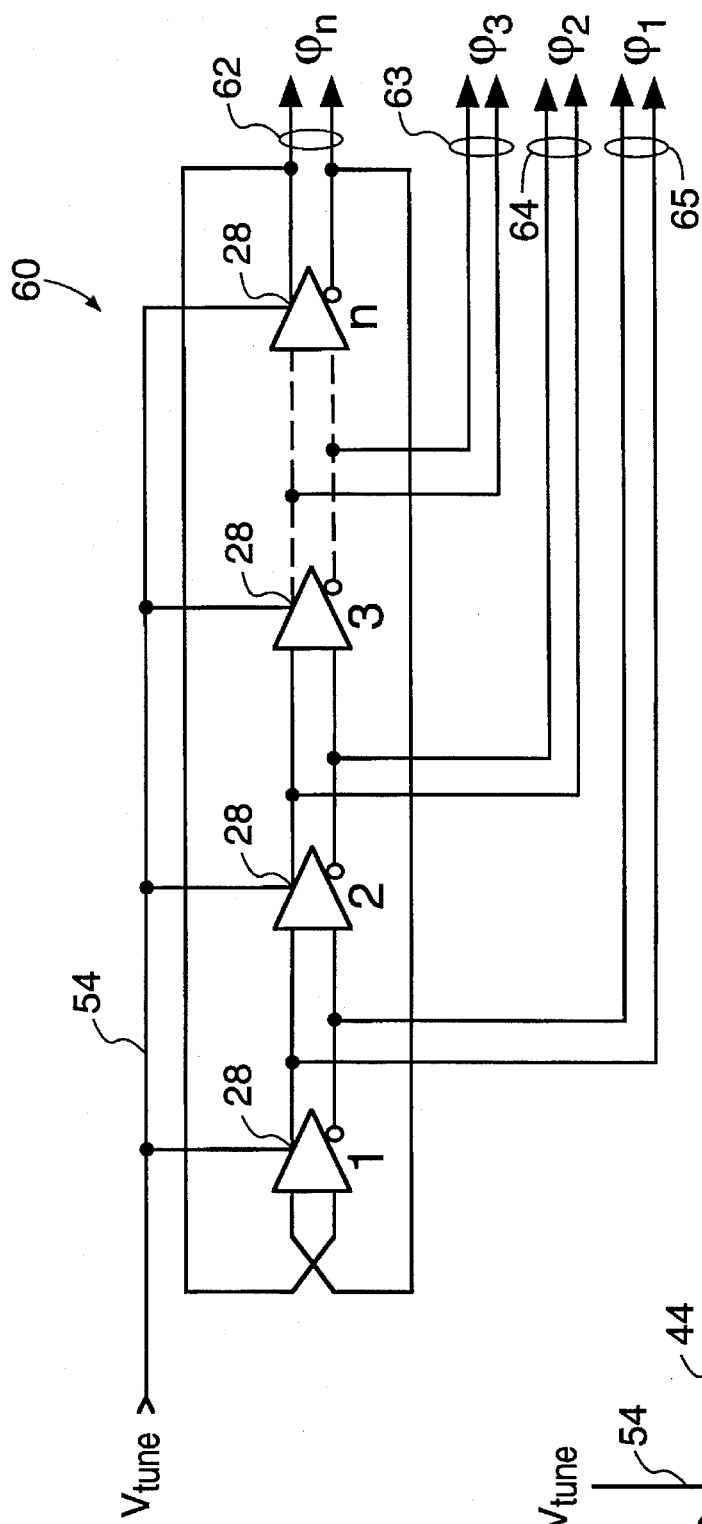
FIG. 5 is a schematic diagram of a differential ring oscillator incorporating the delay stage of FIG. 3 for each stage of the oscillator.

FIG. 3 illustrates a single delay stage 28 for a ring oscillator, such as the oscillator 60 shown in FIG. 5. In FIG. 3, a current source 30 is connected to the drain of PMOS transistor 32. The gate of transistor 32 is connected to its drain, and the gate of transistor 32 is connected to an identical PMOS transistor 34 to cause transistor 34 to act as a current mirror supplying a current identical to that supplied by the current source 30. The sources of transistors 32 and 34 are connected in common to a supply voltage.

The drain of transistor 34 is connected to the sources of PMOS transistors 36 and 38 connected as a differential pair. The gates (connected to input lines 37 and 39) of transistors 36 and 38 are connected to the differential outputs of the previous stage. Thus, transistors 36 and 38 will have opposite states.

NMOS transistors 40 and 42 have their drains connected to the drains of PMOS transistors 36 and 38, respectively, and are connected as cross-coupled loads to enhance the gain of stage 28. The cross-coupling of transistors 40 and 42 causes NMOS transistors 40 and 42 to have opposite states. NMOS transistor 40 is off while PMOS transistor 36 is on, and NMOS transistor 42 is off when PMOS transistor 38 is on, so as to pull-up or pull-down outputs 44 and 46.

An LC tank circuit 48 is connected between differential outputs 44 and 46. Tank circuit 48 exhibits a resonant frequency $f_0$ given by:

$$f_0 = \frac{1}{2\pi \sqrt{LC}} \quad \text{(Eq. 1)}$$

The connection of tank circuit 48 causes the delay stage 28 to act as a band-pass amplifier (i.e., highest gain at resonant frequency). When several band-pass delay stages 28 are connected together in a ring, the net effect is to allow only a signal at the resonant frequency of the tank circuits 48 to propagate around the ring.

The capacitor portion of the tank circuit 48 is preferably formed by back-to-back varactor diodes 50 and 51. The capacitance generated by the varactor diodes 50 and 51 is created by the depletion regions formed by the reversed-biased PN junctions in the diodes, where the depletion regions in the diodes effectively form the dielectric of the capacitor. Such varactor diodes are well known. Given the differential output across the tank circuit 48, one of the diodes 50 and 51 will always be reverse-biased, and thus the series connection of diodes 50 and 51 exhibits a capacitive characteristic as long as the tuning voltage at the common cathodes remains at or above the output 44 or 46 high level.

Resistor 52 is connected between the cathodes of diodes 50/51 and a variable voltage source connected to line 54 and acts as a buffer to isolate the tank circuit 58 from the capacitance of any loop filter (not shown) and charge pump (not shown) which may be used in a phase-locked loop implementation while still allowing the DC bias voltage to be impressed upon the cathodes of the varactor diodes 50/51.

The variable voltage applied to line 54 is selected to adjust the resonant frequency of circuit 48 and, hence, adjust the oscillating frequency of the ring oscillator incorporating the delay stage 28. Such a variable voltage for connection to line 54 is generated in a phase-locked loop implementation where a frequency generated by the ring oscillator is compared to a reference frequency to create an error signal. The voltage on line 54 is then corrected to compensate for the error. Other methods and implementations for generating an error signal for adjusting the frequency of the oscillator are well known and will not be described in detail.

The inductor 56 used in tank circuit 48 may be implemented on-chip using spiral metal patterns. One such on-chip inductor is described in U.S. application, Ser. No. 08/404,019, filed Mar. 13, 1995, entitled "High Q Integrated Inductor," by Richard Merrill, assigned to the present assignee and incorporated herein by reference.

The metallization resistance of the inductor 56, normally, should be minimized to preserve the quality factor (or Q) of the inductor). The quality factor of the inductor is given by $$Q = \omega \frac{L}{R} \qquad \text{(Eq. 2)}$$

Practical implementations of on-chip inductors are in the 1–100 nanohenry range with series resistance in the 2 ohm to 50 ohm range. Varactor diodes, such as diodes 50/51, are commonly implemented as P+/N+ structures or P+/N structures. In many CMOS processes, a lightly doped drain (LDD) N-type implant is available, which when used with a P+ implant provides approximately a 2-to-1 capacitance ratio for the varactor diodes 50/51 over a 3 volt tuning range. In one embodiment, the capacitance is on the order of 10 pf. The series resistance of the varactor diodes 50/51 is relatively important since it affects the Q of the tank circuit 48.

Assuming process variation modulates the spiral inductor value or the varactor diodes by ±10%, the shift in resonant frequency will be less than ±5%. In practical implementations using on-chip spiral inductors, Q values of 5 to 20 are achievable assuming oscillation frequencies in the 500 MHz to 2 GHz range. This reduction in Q can actually be an advantage in the case of frequency synthesizers, since it allows a reasonable (±10%) tuning range to overcome center frequency errors due to process variations. Lower Q contributes to higher phase noise, however.

Since the structure is differential, there is reduced susceptibility to noise coupling. The natural DC bias across the tank circuit 48 is zero; therefore, the tank circuit 48 does not need a DC blocking capacitor which could severely limit its Q because on-chip capacitors can be quite resistive.

Figure 4:
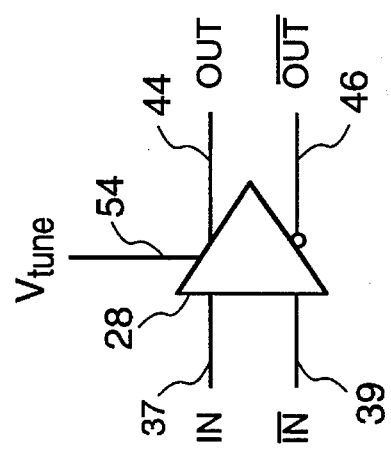
FIG. 4 is a functional representation of the delay stage of FIG. 3.

FIG. 4 is a representation of the single delay stage 28 of FIG. 3 shown as a standard inverter 28 with input lines 37 and 39 and output lines 44 and 46.

FIG. 5 illustrates the delay stage 28 connected in a ring oscillator 60 having differential inputs and differential outputs. There may be an even number or odd number of delay stages 28 in the ring oscillator 60. Multiple phase outputs are shown on differential outputs 62–65. All components can be fabricated on-chip for frequency ranges of approximately 200 MHz–2 GHz.

In a preferred embodiment, all circuitry within the ring oscillator of FIG. 5 is contained on-chip. In an alternate embodiment, the capacitor (diodes 50/51) or inductor 56 or both are off-chip. An off-chip inductor is capable of obtaining a higher inductance value and a better Q value than conventional on-chip inductors.

Figure 6:
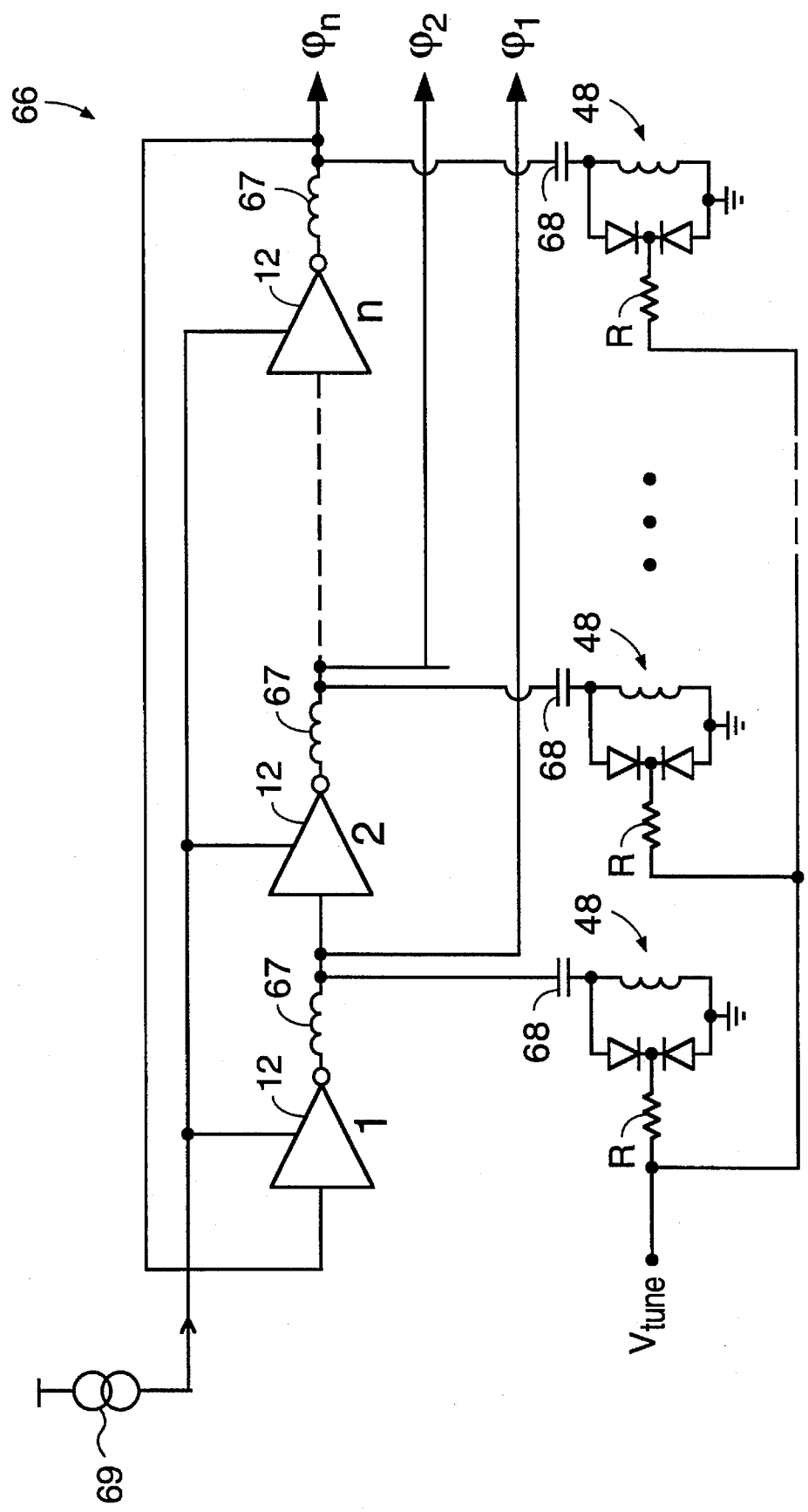
FIG. 6 is a schematic diagram of a single-ended ring oscillator in accordance with another embodiment of the invention.

In a single ended embodiment, shown in FIG. 6, a tank circuit 48 is connected between each conventional inverter 12 output and ground to force the frequency of the ring oscillator 66 to be that of the tank circuit 48 resonant frequency. A resistor R is used for isolation, as described with respect to resister 52 in FIG. 3. A separate inductor 67 may be connected in series between each stage to prevent bias wandering around the ring and thus prevent secondary low frequency oscillations. A DC blocking capacitor 68 is connected in series with the tank circuit 48. A fixed current source 69 supplies current to the circuit.

Figure 7:
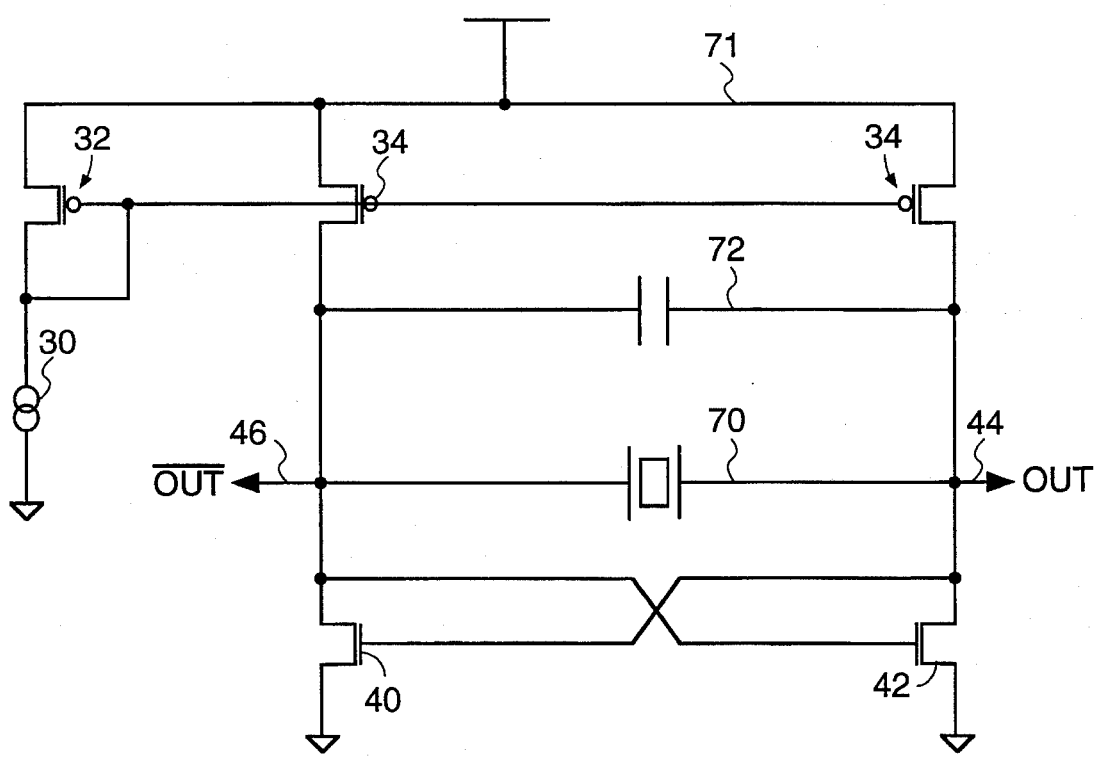
FIG. 7 is a schematic diagram of an oscillator using a crystal as a resonant element.

In other embodiments, a resonant circuit is used which is not a LC tank circuit. Any suitable resonant circuit may be used instead of tank circuit Instead of a multi-stage ring oscillator circuit, a crystal resonator 70 (FIG. 7) may be connected as a resonant element within an oscillator. Such a resulting oscillator 71 is shown in FIG. 7, with crystal resonator 70 and capacitor 72 connected across the differential outputs 44 and 46. Like elements in FIGS. 3 and 7 perform like functions and are not repeated herein. As shown in FIG. 7, current mirror transistor 34 is used in both legs of the differential circuit. The elements 30, 32, 34, 40, and 42 act as previously described with respect to FIG. 3 to form a differential gain stage which supplies energy to the parallel mode fundamental crystal resonator 70. Capacitor 72 acts as the parallel load capacitance for the fundamental mode crystal resonator 70. The operation of the circuit of FIG. 7 would be understood by those skilled in the art.

Figure 8:
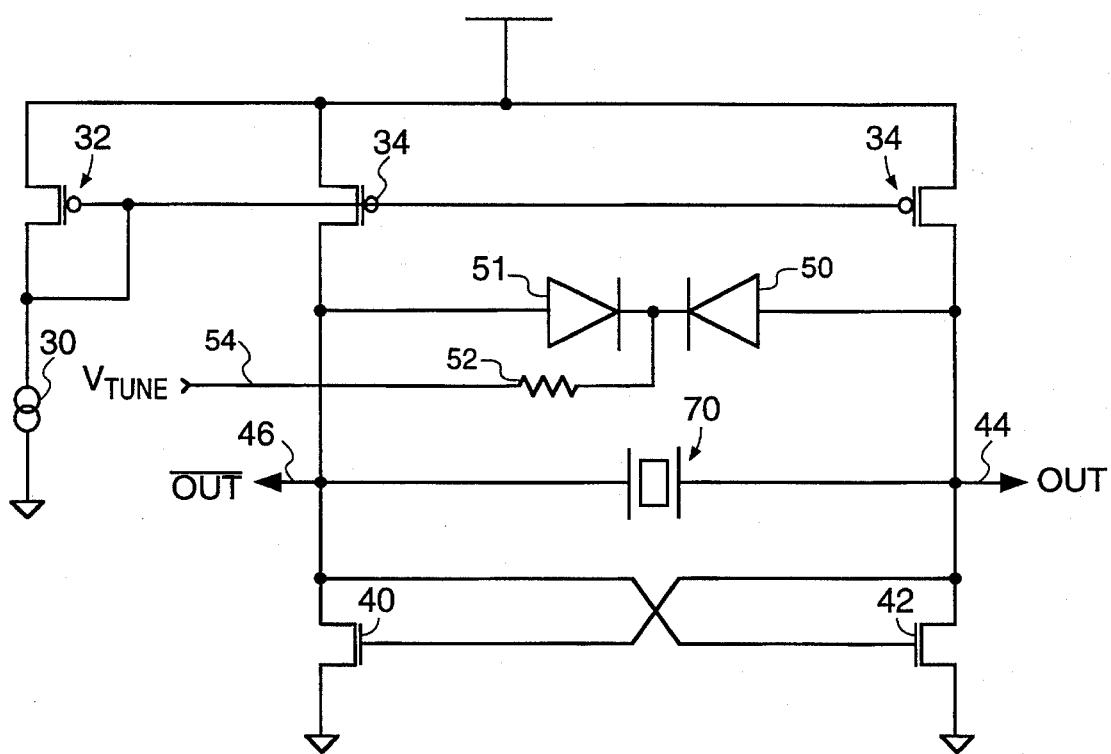
FIG. 8 is a schematic diagram of a voltage controlled crystal oscillator using varactor diodes to change the nominal frequency of the crystal resonator.

FIG. 8 is a voltage controlled crystal oscillator, which is identical to FIG. 7 except that capacitor 72 has been replaced with varactor diodes 50 and 51, whose capacitance is controlled by a voltage on line 54. Resistor 52 is identical to resistor 52 shown in FIG. 3. The variable capacitances of diodes 50/51 pull (or warp) the nominal frequency of the crystal resonator 70. In a practical embodiment, the oscillator frequency may be changed by 10–100 ppm.

Figure 9:
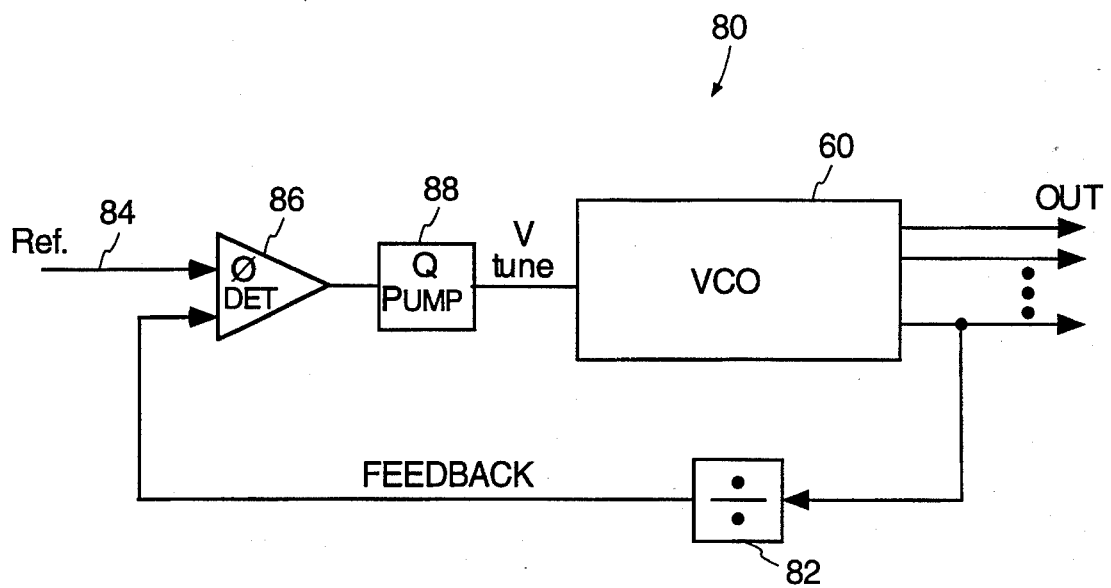
FIG. 9 is a schematic diagram of a phase-locked loop incorporating the preferred ring oscillator.

FIG. 9 illustrates the oscillator 60 in FIG. 5 (or the oscillators in FIGS. 6–8) connected as a VCO in a conventional phase-locked loop (PLL) 80. In the PLL 80, one of the multi-phase outputs of VCO 60 is divided, as necessary, by divider 82 and compared to a reference frequency 84 using a phase detector 86. The output of phase detector 86 controls a charge pump 88 (which contains an output filter) to generate a voltage proportional to the phase error. The voltage adjusts the output frequency of VCO 60 to minimize the error.

It should be understood that although the various transistors used in the preferred embodiments are CMOS transistors, well known components which perform a similar function, such as bipolar transistors, may be used instead.

While particular embodiments of the present invention have been shown and described, it would be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A ring oscillator comprising a plurality of inverters connected in series as a ring, each of said inverters comprising:

a differential amplifier having
      a first input terminal and a second input terminal for receiving input signals having opposite states,
      a first output terminal and a second output terminal for providing output signals of said differential amplifier having opposite states,
      a first current source providing current to a first node,
      a first transistor having a first current handling terminal connected to said first node and having its control terminal connected to said first input terminal,
      a second transistor having a first current handling terminal coupled to said first node and having its control terminal coupled to said second input terminal,
      wherein a second current handling terminal of said first transistor is connected to said first output terminal, and a second current handling terminal of said second transistor is connected to said second output terminal; and
   a resonant circuit connected between said first output terminal and said second output terminal, said resonant circuit having its highest impedance at a resonant frequency of said resonant circuit, whereby said resonant circuit causes said ring oscillator to oscillate at approximately said resonant frequency of said resonant circuit.

2. The circuit of claim 1 wherein said resonant circuit is an LC tank circuit.

3. The circuit of claim 2 wherein a capacitor in said LC tank circuit is variable so as to control the resonant frequency of said resonant circuit.

4. The circuit of claim 3 wherein said capacitor comprises a varactor diode.

5. The circuit of claim 4 wherein said capacitor comprises two varactor diodes having their cathodes connected to each other and said cathodes connected to a voltage source.

6. The circuit of claim 3 wherein said capacitor varies in accordance with a variable control voltage for changing the frequency of said ring oscillator.

7. The circuit of claim 6 further comprising:

a phase detector having a first terminal for receiving a signal related to a frequency of said ring oscillator, and a second terminal for receiving a reference signal, an output of said phase detector producing an error signal, said error signal being used to generate said variable control voltage for changing the frequency of said ring oscillator.

8. The circuit of claim 2 wherein said LC tank circuit is formed on the same monolithic structure containing the remainder of the ring oscillator.

9. The circuit of claim 1 further comprising:

a third transistor connected between said first output terminal and a reference voltage; and a fourth transistor connected between said second output terminal and said reference voltage, said third transistor and said fourth transistor being connected as a cross-coupled load so as to have opposite states and to cause said third transistor to have a state opposite that of said first transistor and said fourth transistor to have a state opposite that of said second transistor.

10. The circuit of claim 9 wherein said first transistor and said second transistor are PMOS transistors, and said third transistor and said forth transistor are NMOS transistors.

11. The circuit of claim 1 wherein said resonant circuit has a resonant frequency between the range of approximately 200 MHz and 2 GHz.

12. The circuit of claim 1 wherein said first input terminal is connected to a second output terminal of a preceding stage, and said second input terminal is connected to a first output terminal of said preceding stage.

* * * * *